US012743139B2

(12) United States Patent
Huang

(10) Patent No.: US 12,743,139 B2
(45) Date of Patent: Sep. 22, 2026

(54) COOLING PAD FOR LAPTOP COMPUTER

(71) Applicant: Cheng Yu Huang, New Taipei (TW)

(72) Inventor: Cheng Yu Huang, New Taipei (TW)

( * ) Notice: Subject to any disclaimer, the term of this patent is extended or adjusted under 35 U.S.C. 154(b) by 354 days.

(21) Appl. No.: 18/643,180

(22) Filed: Apr. 23, 2024

(65) Prior Publication Data

US 2025/0331128 A1 Oct. 23, 2025

(51) Int. Cl.
*G06F 1/20* (2006.01)
*H05K 7/20* (2006.01)

(52) U.S. Cl.
CPC ......... *G06F 1/203* (2013.01); *H05K 7/20145* (2013.01)

(58) Field of Classification Search
CPC ........................................................ G06F 1/203
See application file for complete search history.

(56) References Cited

U.S. PATENT DOCUMENTS 3,453,729 A * 7/1969 Larson .................... B26B 5/001 30/162
8,699,221 B2 * 4/2014 Huang .................... G06F 1/203 361/679.48
9,229,495 B2 * 1/2016 Kuo ...................... G06F 1/1658
9,395,773 B1 * 7/2016 Huang .................... G06F 1/203
11,092,986 B2 * 8/2021 North ...................... G06F 1/203
2020/0391396 A1 * 12/2020 Fossella .................... B26B 1/08
2023/0301016 A1 * 9/2023 Huang .................... G06F 1/203 361/695

FOREIGN PATENT DOCUMENTS

CN 213843959 U * 7/2021
TW 1919898 B * 3/2026

* cited by examiner

*Primary Examiner* — Robert J Hoffberg
(74) *Attorney, Agent, or Firm* — Demian K. Jackson; Jackson IPG PLLC

(57) ABSTRACT

A laptop cooling pad is provided with a casing including a base having a louver, a PCB, and connectors electrically connected to the PCB; and a cover having a recess on a top and a through hole disposed through the recess and communicating with the louver; a hollow flexible sealing pad disposed on an edge of the cover; a fan disposed on an edge of the through hole and electrically connected to the PCB; two pivotal members disposed at two sides of the recess respectively; and two fastening members disposed at a front portion of the recess. The fastening member includes a support member having an internal groove and a plurality of vertically disposed projections disposed on the internal groove; and a slide member disposed in the internal groove and having a snapping element on a top, and a protrusion moveably fastened between any two adjacent projections.

1 Claim, 10 Drawing Sheets

COOLING PAD FOR LAPTOP COMPUTER

FIELD OF THE INVENTION

The invention relates to external cooling devices for computer and more particularly to a cooling pad for a laptop computer having improved characteristics.

BACKGROUND OF THE INVENTION

Computer, communication, and consumer electronics (3C) are popular throughout the world in which laptop computers are characterized by lightweight, portability, multifunction, productivity, and a long period time of use.

However, the laptop computers are poor in heat dissipation ability due to its compactness and limited space.

Usually, if a laptop computer is used for a short period of time, its heat dissipation is not a problem. However, if it is used for a long time, it is more likely to overheat. Overheating may cause damage to the hard drive or the main board, and even cause damage to the computer itself. Users are at risk, especially when popular esports or video game programs are executed very quickly. Because of their fast operating speed, heat accumulation and temperature rise are more obvious, so that they are suitable for use in esports and video games. Laptop computers dedicated to video games usually require a larger screen size and many air vents at the bottom. Therefore, laptop computers dedicated to video games with larger screens and improved heat dissipation capabilities should be developed accordingly.

To the contrary, smaller laptop computers, in addition to smaller screens, usually do not have air vents at the bottom and a cooling fan next to the air vents. Instead, they use the internal wind to blow through the gap between the screen and the main board to expel gas and excessive heat.

Thus, the heat dissipation requirements for gaming-specific laptop computers are obviously higher than those for general laptop computers. In other words, the cooling pad suitable for this gaming-specific laptop computer adopts a high-speed and high-air volume turbine fan. The upper edge of the groove is in close contact with the bottom of the gaming laptop computer. The turbine fan in the groove of the cooling pad blows strong air to the bottom of the gaming laptop computer and allows the air to flow through the air vents at the bottom. The cooling air flows into the laptop computer for heat dissipation. However, if it is used for a smaller laptop computer, not only it will not make close contact, but also the air will not have a larger flow because there are no air vents at the bottom to vent and dissipate heat. The large air volume generated by the turbo fan will cause great noise and cause the laptop computer to vibrate greatly.

Thus, the need for improvement still exists.

SUMMARY OF THE INVENTION

It is therefore one object of the invention to provide a cooling pad for a laptop computer comprising a casing including a base having a louver, a PCB, and a plurality of connectors disposed on a rear end of the base and electrically connected to the PCB; and a cover having a recess on a top and a through hole disposed through the recess and communicating with the louver; a hollow flexible sealing pad disposed on an edge of the cover; a fan disposed on an edge of the through hole and electrically connected to the PCB; two pivotal members disposed at two sides of the recess respectively; and two fastening members disposed at a front portion of the recess, each of the fastening members including a support member having an internal groove and a plurality of vertically disposed projections disposed on the internal groove; and a slide member disposed in the internal groove and having a snapping element on a top, and a protrusion moveably fastened between any two adjacent projections.

The above and other objects, features and advantages of the invention will become apparent from the following detailed description taken with the accompanying drawings.

DETAILED DESCRIPTION OF THE INVENTION

Figure 1:
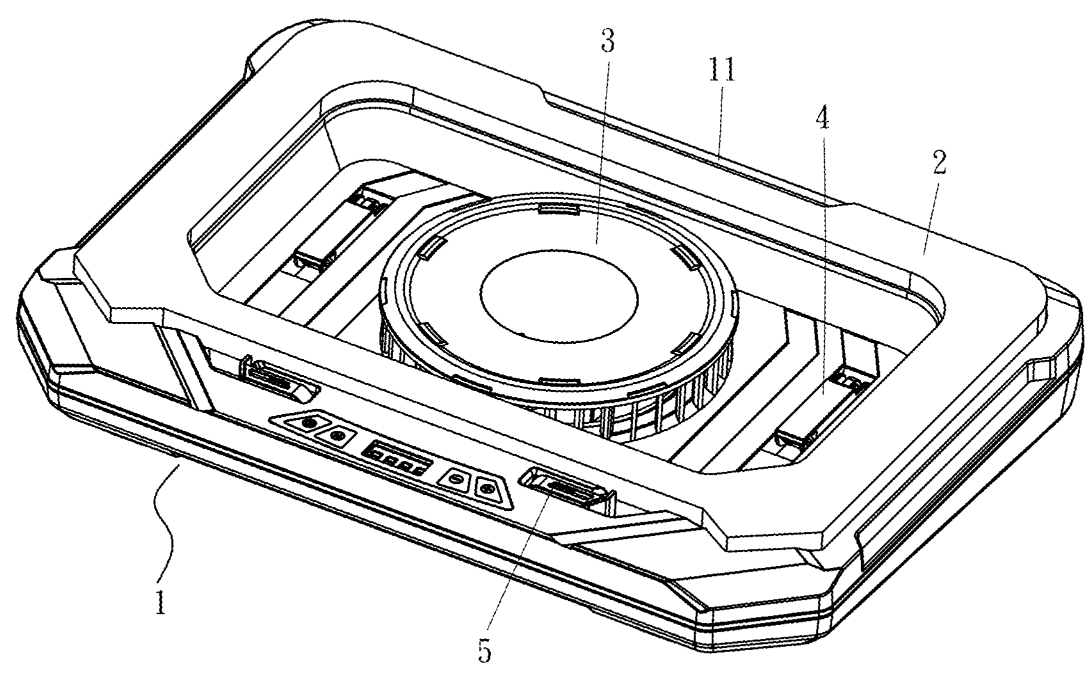
FIG. 1 is a perspective view of a cooling pad according to the invention, viewing from the top.
Figure 2:
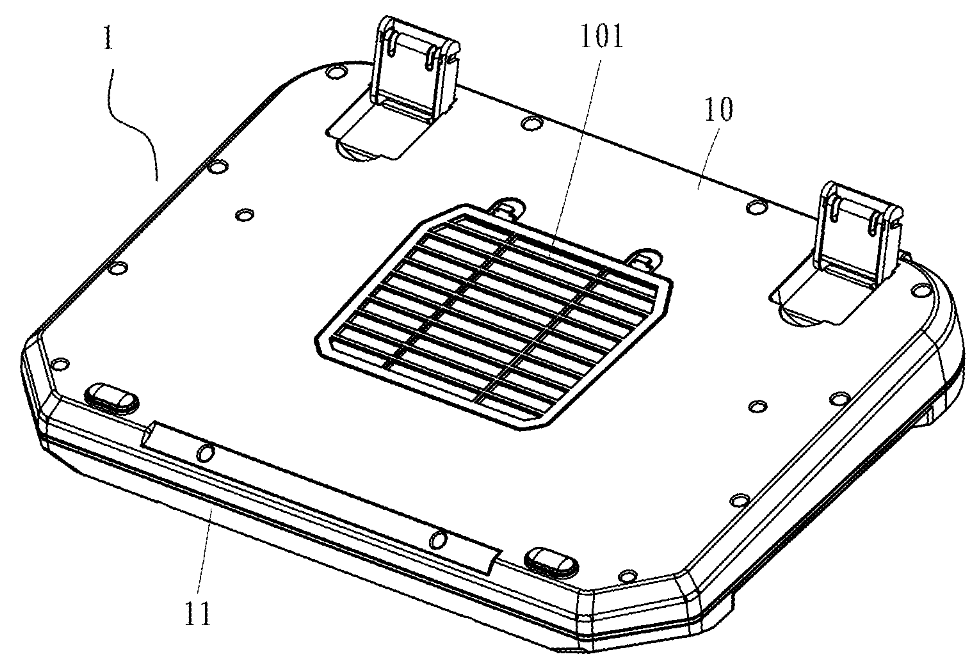
FIG. 2 is another perspective view of the cooling pad, viewing from the bottom.
Figure 3:
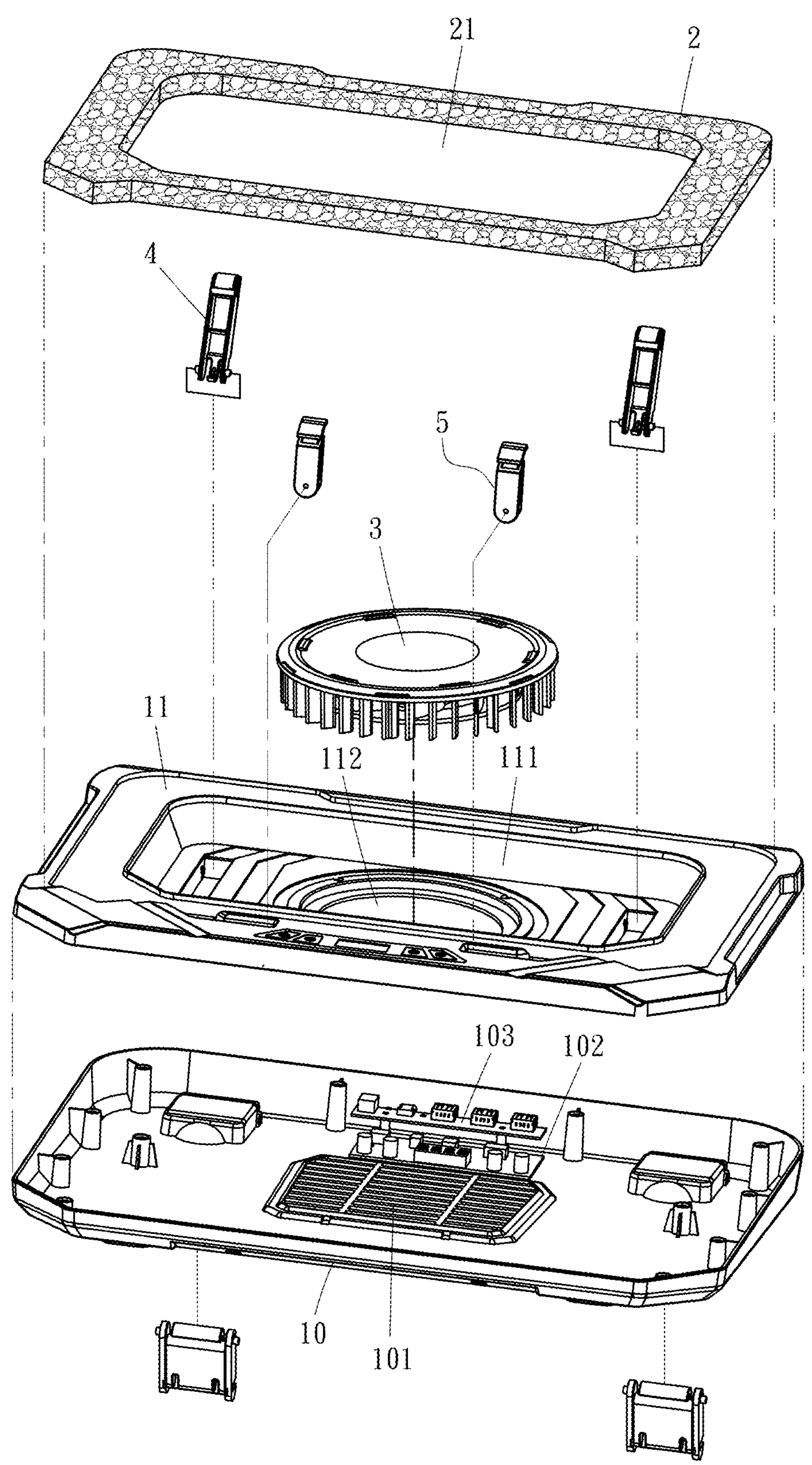
FIG. 3 is an exploded view of the cooling pad.
Figure 4:
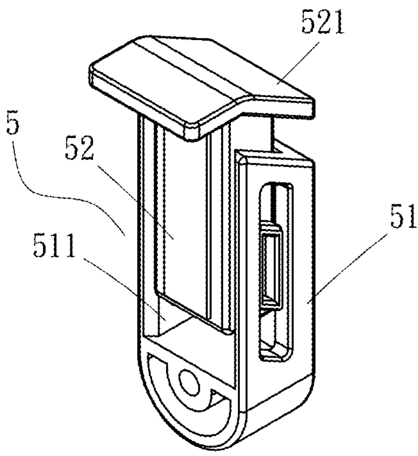
FIG. 4 is a perspective view of the fastening member.
Figure 5:
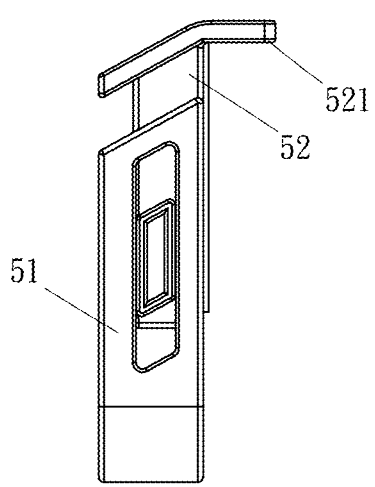
FIG. 5 is a side elevation of the fastening member.
Figure 6:
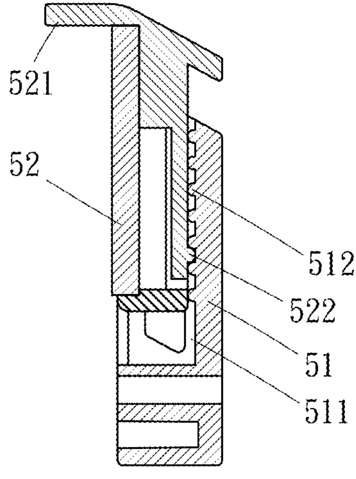
FIG. 6 is a longitudinal sectional view of the fastening member.

Referring to FIGS. 1 to 14, a cooling pad for a laptop computer in accordance with the invention comprises a casing 1, a flexible sealing pad 2, a fan 3, two pivotal members 4, and two fastening members 5 as discussed in detail below.

The casing 1 includes a base 10 and a cover 11. The base 10 include a louver 101, a printed circuit board (PCB) 102, and a plurality of connectors 103 disposed on a rear end of the base 10 and electrically connected to the PCB 102. The cover 11 includes a recess 111 on a top and a through hole 112 disposed through the recess 111 and communicating with the louver 101.

The flexible sealing pad 2 is placed on an edge of the cover 11 and includes a hollow 21.

The fan 3 is disposed on an edge of the through hole 112, electrically connected to the PCB 102.

The pivotal members 4 are disposed at two sides of the recess 111 respectively.

The fastening members 5 are disposed at a front portion of the recess 111. The fastening member 5 includes a support member 51 having an internal groove 511 and a plurality of vertically disposed projections 512 disposed on the internal groove 511; and a slide member 52 disposed in the internal groove 511 and having a snapping element 521 on a top, and a protrusion 522 moveably fastened between any two adjacent projections 512.

Figure 7:
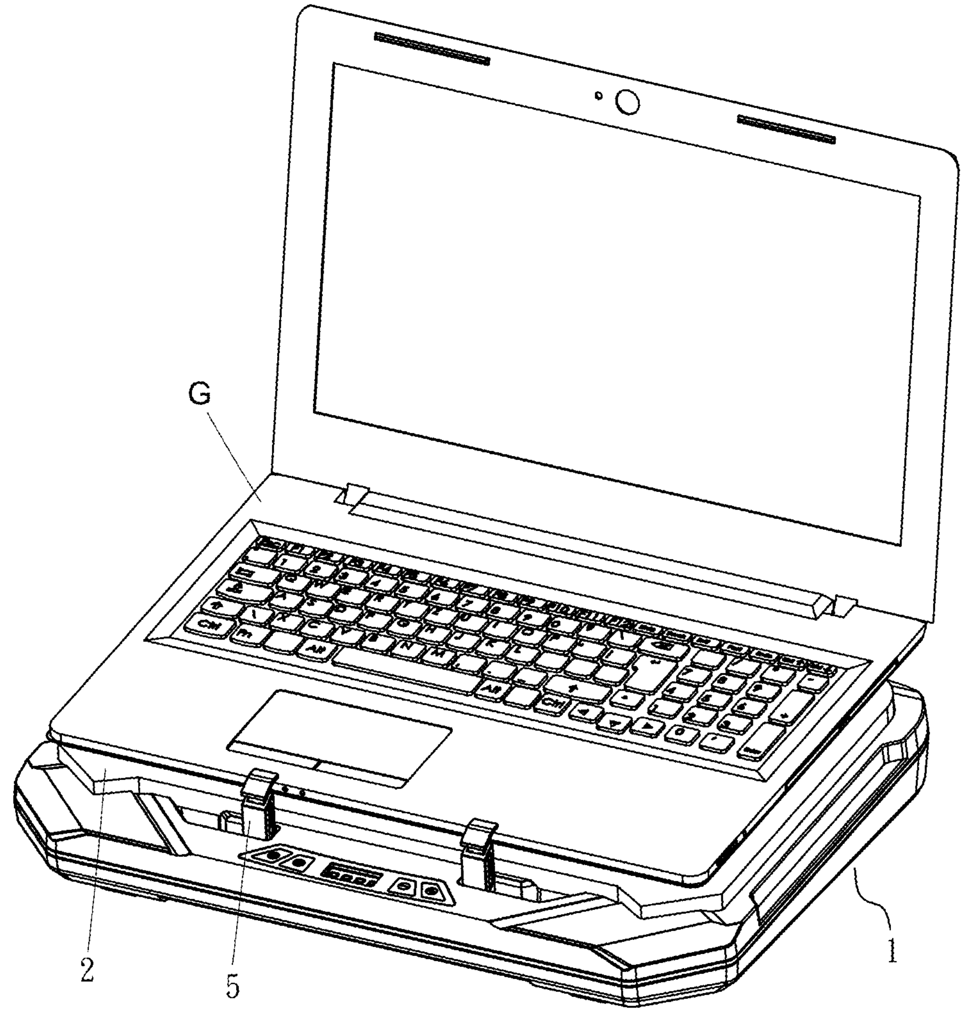
FIG. 7 is a perspective view of a laptop computer placed on the cooling pad, viewing from the front, the laptop computer being for video game.
Figure 8:
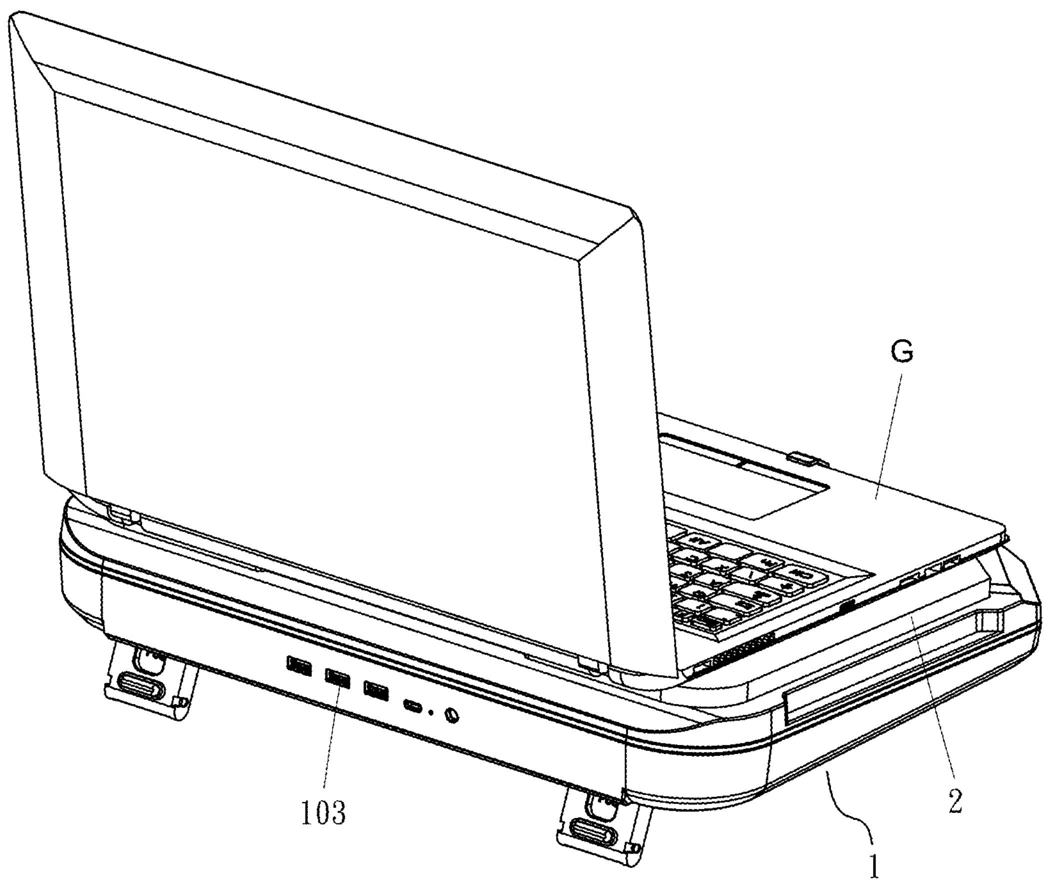
FIG. 8 is a perspective view of the laptop computer placed on the cooling pad, viewing from the rear.
Figure 9:
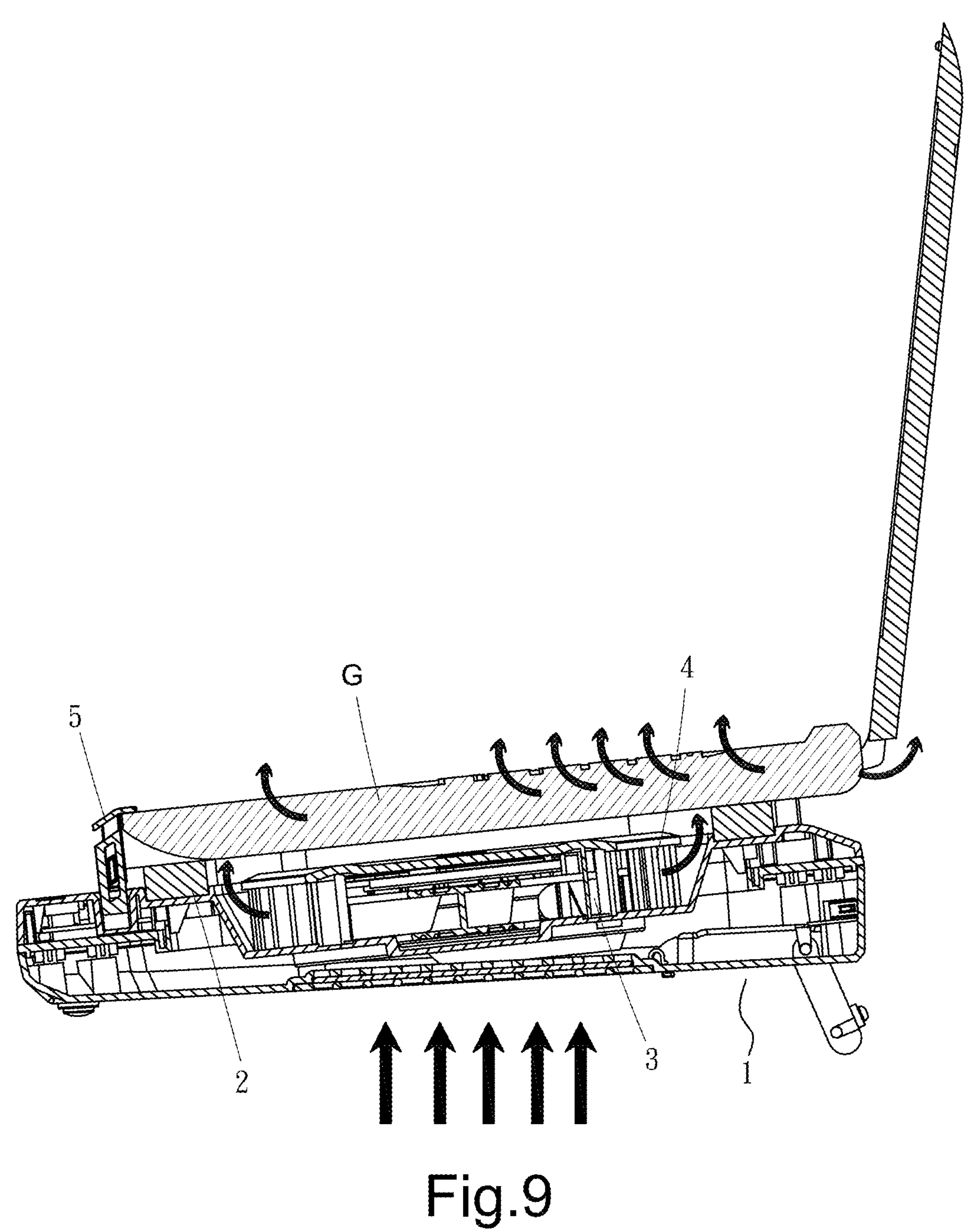
FIG. 9 is a longitudinal sectional view of FIG. 7.
Figure 10:
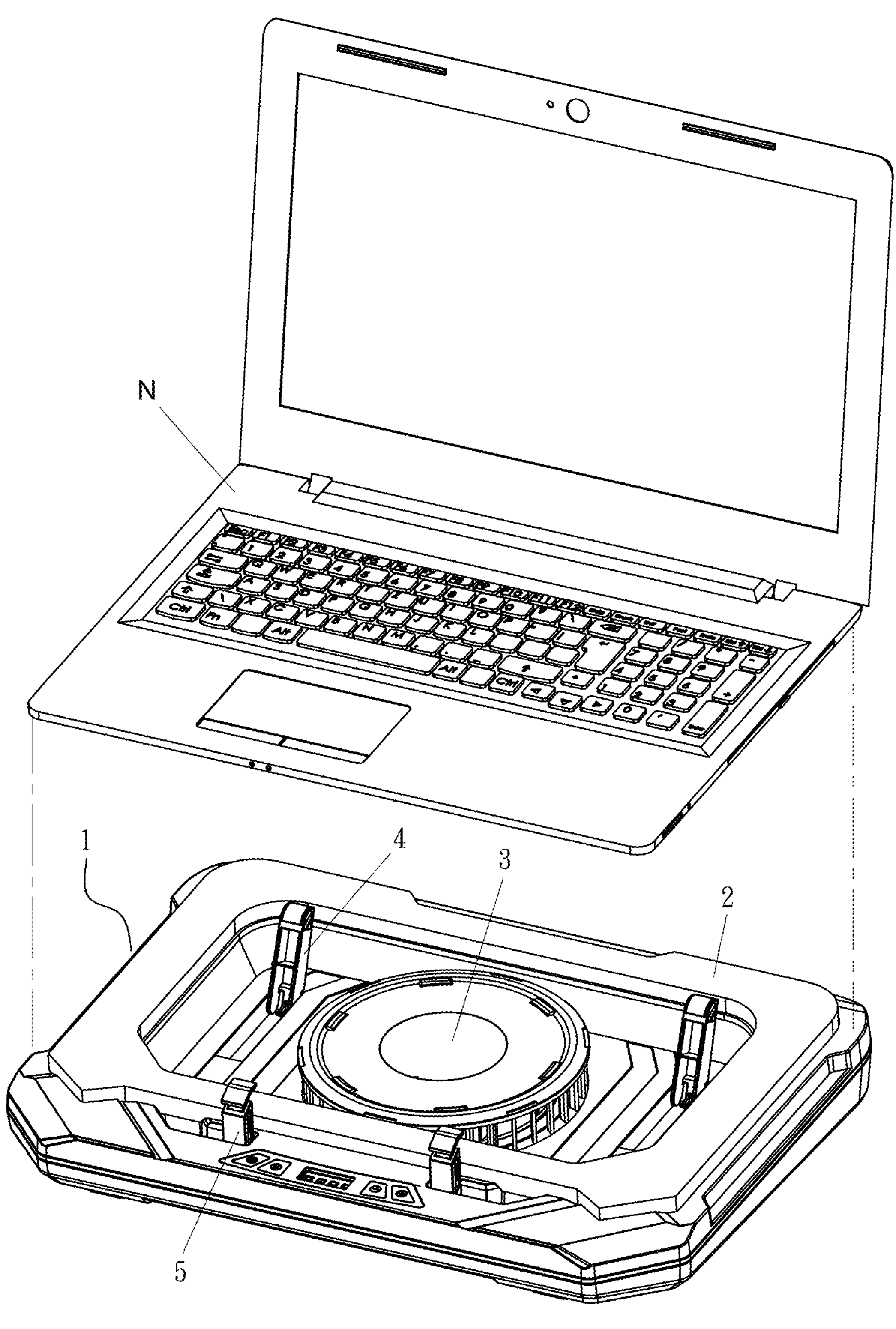
FIG. 10 is a perspective, exploded view of FIG. 7, the laptop computer being ordinary.
Figure 11:
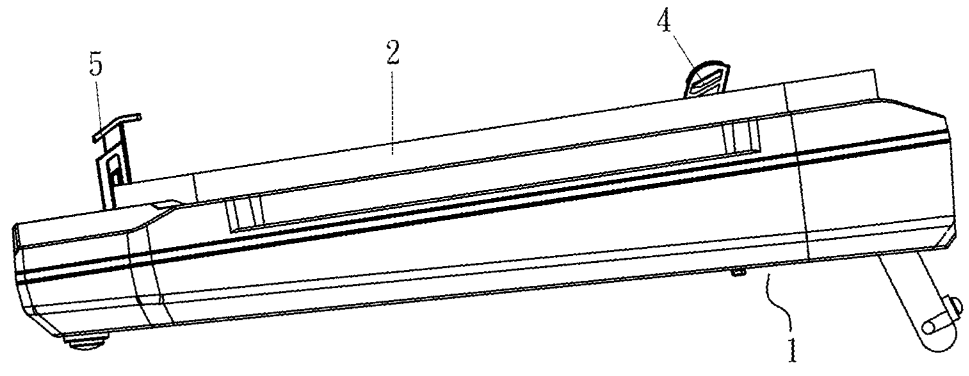
FIG. 11 is a side elevation of the cooling pad with the pivotal member being pivoted upward.
Figure 12:
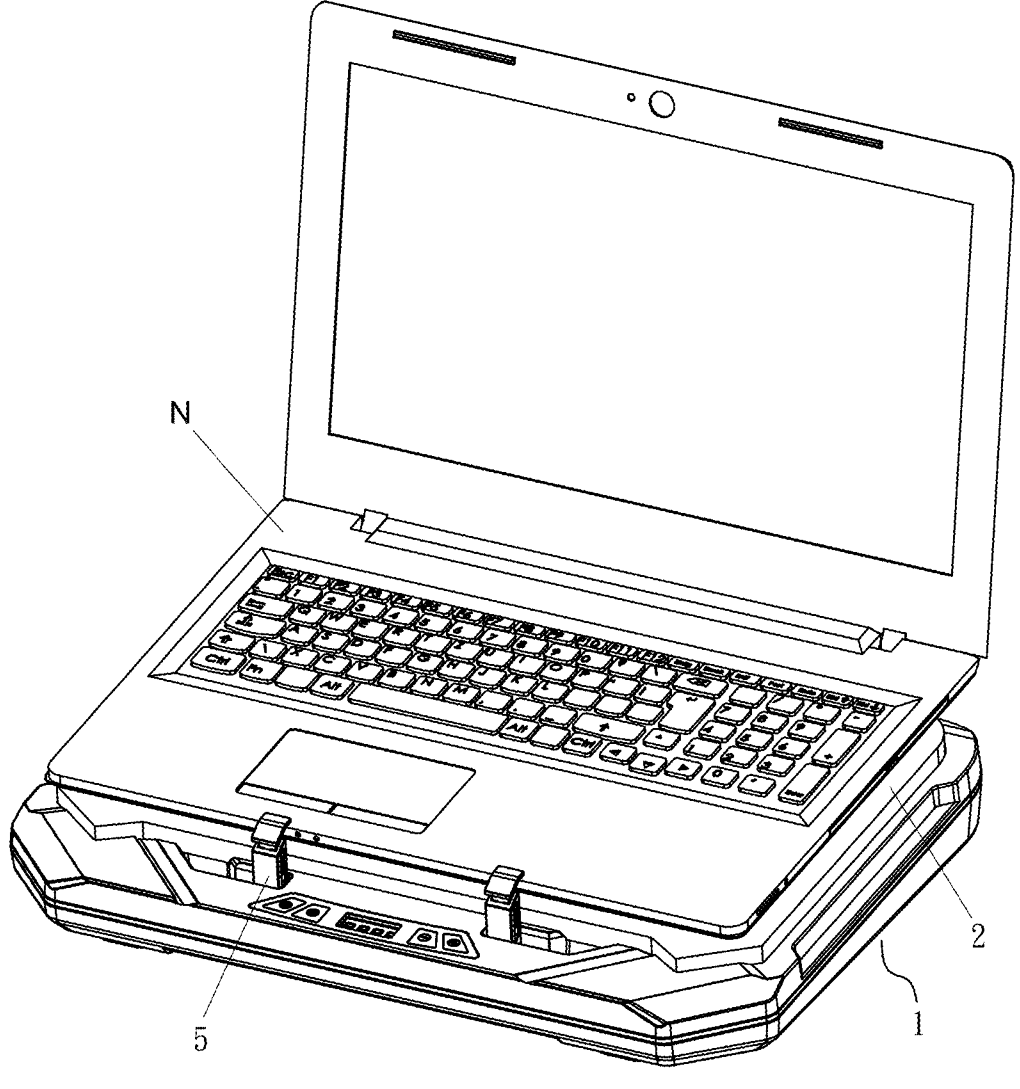
FIG. 12 is a perspective view of the cooling pad shown in FIG. 11 and a laptop computer being placed thereon, the laptop computer being ordinary, and viewing from the front.
Figure 13:
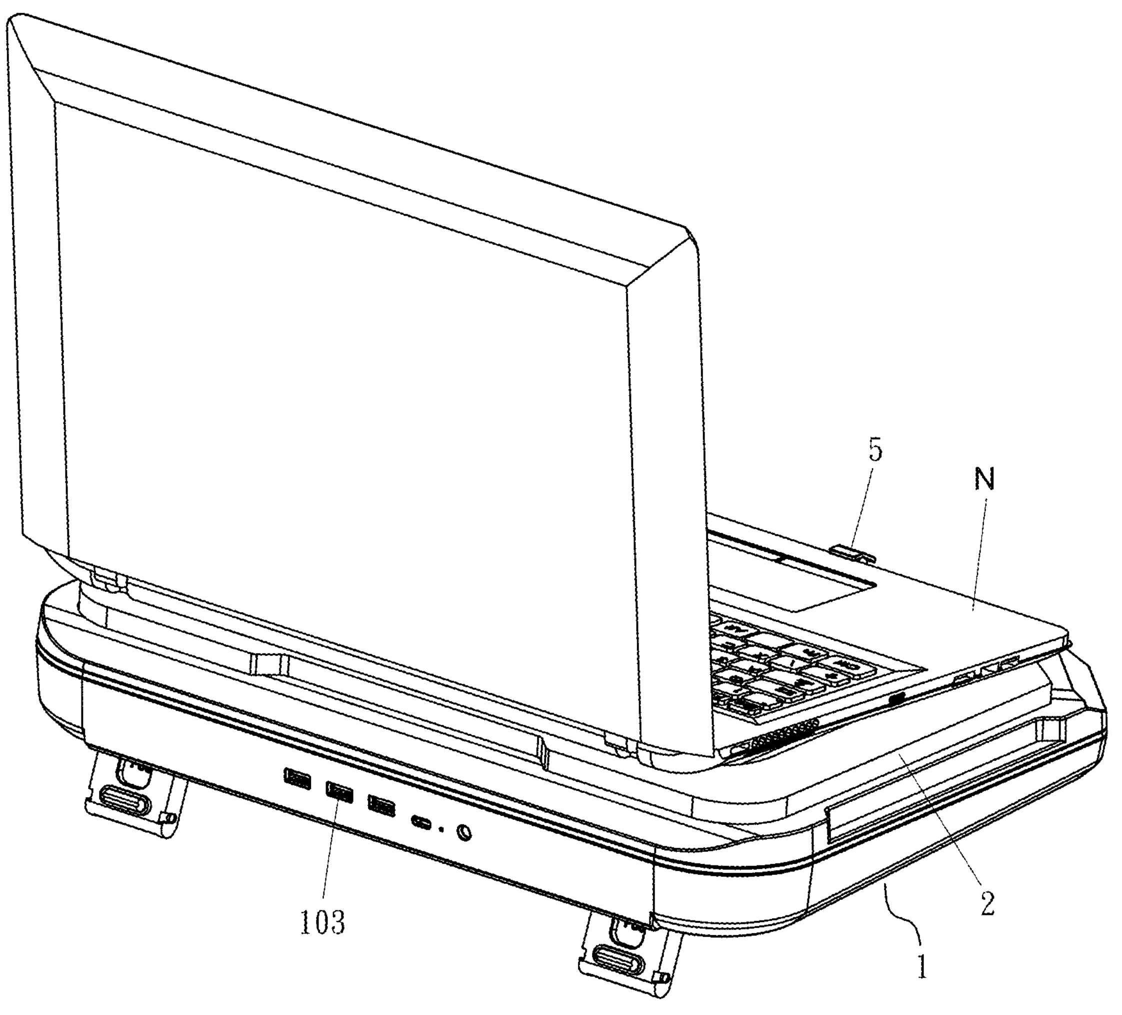
FIG. 13 is a view similar to FIG. 12 but viewing from the rear.
Figure 14:
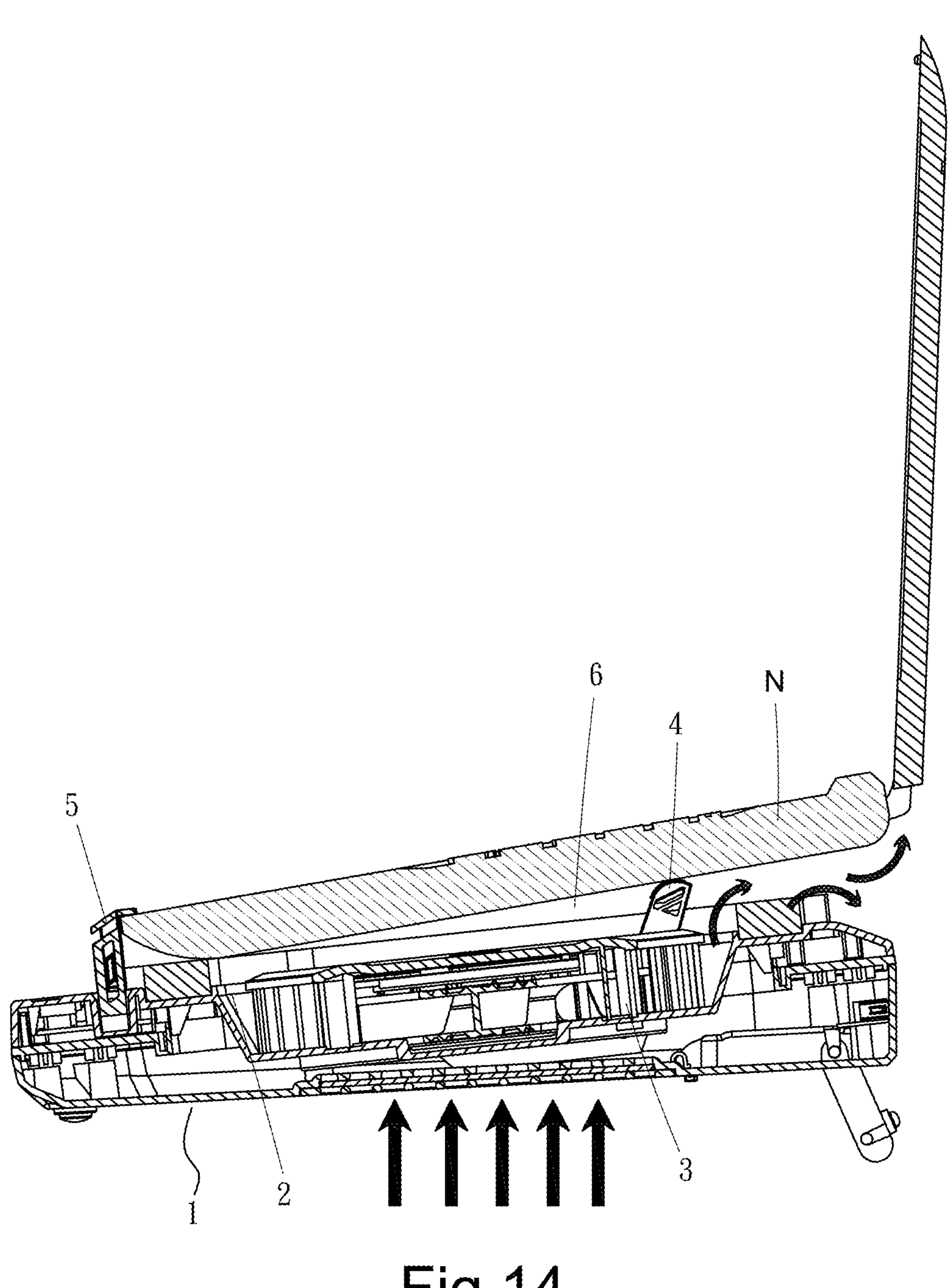
FIG. 14 is a longitudinal sectional view of FIG. 12.

As shown in FIGS. 7 to 9 specifically, the cooling pad used for a laptop computer G for video game is shown. The laptop computer G is placed on the casing 1. The fastening members 5 are pulled upward to fasten a front end of the laptop computer G between the fastening members 5 and the flexible sealing pad 2. In use, a current of air is produced by the fan 3 by drawing air through the louver 101. Finally, the current of air flows into the laptop computer G to take heat away from the laptop computer G.

As shown in FIGS. 10 to 14 specifically, the cooling pad used for an ordinary laptop computer N is shown. The laptop computer N is placed on the casing 1. The fastening members 5 are pulled upward to fasten the front end of the laptop computer N between the fastening members 5 and the flexible sealing pad 2. Also, the pivotal members 4 are pivoted upward to support the laptop computer N and form a gap 6 between the bottom of the laptop computer N and the fan 3. In use, a current of air is produced by the fan 3 by drawing air through the louver 101 and the gap 6. Finally, the current of air flows into the laptop computer N to take heat away from the laptop computer N. The provision of the gap 6 can decrease noise and decrease the strength of the current air, thereby decreasing vibration of the laptop computer N.

In an adjustment of each fastening member 5, a user may pull up or push down the slide member 52 along the internal groove 511 by holding the snapping element 521, thereby moving the protrusion 522 between any two adjacent projections 512.

While the invention has been described in terms of embodiments, those skilled in the art will recognize that the invention can be practiced with modifications within the spirit and scope of the appended claim.

What is claimed is:

1. A cooling pad for a laptop computer, comprising:

a casing including a base having a louver, a printed circuit board (PCB), and a plurality of connectors disposed on a rear end of the base and electrically connected to the PCB; and a cover having a recess on a top and a through hole disposed through the recess and communicating with the louver;

a hollow flexible sealing pad disposed on an edge of the cover;

a fan disposed on an edge of the through hole and electrically connected to the PCB;

two pivotal members disposed at two sides of the recess respectively, the two pivotable members configured to support the laptop computer and form a gap between a bottom of the laptop computer and the fan; and two fastening members disposed at a front portion of the recess, each of the fastening members including a support member having an internal groove and a plurality of vertically disposed projections disposed on the internal groove; and a slide member disposed in the internal groove and having a snapping element on a top, and a protrusion moveably fastened between any two adjacent ones of the vertically disposed projections.

* * * * *